US010227693B1

(12) United States Patent
Baggett

(10) Patent No.: US 10,227,693 B1
(45) Date of Patent: Mar. 12, 2019

(54) OUTGASSING IMPACT ON PROCESS CHAMBER REDUCTION VIA CHAMBER PUMP AND PURGE

(71) Applicant: Axcelis Technologies, Inc., Beverly, MA (US)

(72) Inventor: John F. Baggett, Amesbury, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 15/884,492

(22) Filed: Jan. 31, 2018

(51) Int. Cl.
| | | |
|---|---|---|
| *H01L 21/67* | (2006.01) |
| *H01J 37/04* | (2006.01) |
| *H01L 21/683* | (2006.01) |
| *C23C 14/48* | (2006.01) |
| *C23C 14/54* | (2006.01) |

(52) U.S. Cl.
CPC ............ *C23C 14/48* (2013.01); *C23C 14/541* (2013.01); *H01L 21/67017* (2013.01); *H01L 21/67098* (2013.01); *H01L 21/6833* (2013.01)

(58) Field of Classification Search
CPC ....... G01N 2021/8416; G01N 2021/59; G01N 2021/9505; H01J 37/08; H01J 2237/022; H01L 21/681
See application file for complete search history.

(56) References Cited

U.S. PATENT DOCUMENTS

| | | | |
|---|---|---|---|
| 7,381,969 B2 | 6/2008 | Fasheh | |
| 9,236,216 B2 | 1/2016 | Lee | |
| 9,378,992 B2 | 6/2016 | Huseinovic | |
| 2011/0240889 A1* | 10/2011 | Colvin | H01J 37/04 250/492.21 |
| 2017/0207054 A1* | 7/2017 | Colvin | H01J 37/3171 |
| 2017/0287579 A1* | 10/2017 | Colvin | H01J 9/32 |
| 2017/0330725 A1* | 11/2017 | Colvin | H01J 37/3002 |
| 2018/0204755 A1* | 7/2018 | Baggett | H01J 37/32412 |

* cited by examiner

*Primary Examiner* — Mounir S Amer
(74) *Attorney, Agent, or Firm* — Eschweiler & Potashnik, LLC

(57) ABSTRACT

A workpiece processing system, has a process chamber coupled to an outgassing chamber. An outgassing chamber valve selectively isolates a processing environment from an outgassing environment defined within the respective process and outgassing chambers. A heater selectively heats the workpiece on a workpiece support in the outgassing chamber to a first predetermined temperature. A vacuum source selectively depressurizes the outgassing chamber to a first predetermined pressure. A workpiece transfer apparatus selectively transfers the workpiece between the outgassing and process chambers. A controller isolates the workpiece in the outgassing chamber by the outgassing chamber valve and is configured to concurrently heat the workpiece to the first predetermined temperature and depressurize the outgassing chamber to the first predetermined pressure by the respective heater and vacuum source. The workpiece is maintained at the first predetermined temperature and the first predetermined pressure for a first period of time associated with a predetermined outgassing threshold.

19 Claims, 2 Drawing Sheets

OUTGASSING IMPACT ON PROCESS CHAMBER REDUCTION VIA CHAMBER PUMP AND PURGE

TECHNICAL FIELD

The present invention relates generally to ion implantation systems, and more specifically ameliorating outgassing of a workpiece in an ion implantation system.

BACKGROUND

In semiconductor processing, many operations, such as ion implantation, may be performed on a workpiece or semiconductor wafer. As ion implantation processing technology advances, a variety of ion implantation temperatures at the workpiece can be implemented to achieve various implantation characteristics in the workpiece. For example, in conventional ion implantation processing, three temperature regimes are typically considered: cold implants, where process temperatures at the workpiece are maintained at temperatures below room temperature, hot or heated implants, where process temperatures at the workpiece are maintained at high temperatures typically ranging from 100–600° C., and so-called quasi-room temperature implants, where process temperatures at the workpiece are maintained at temperatures slightly elevated above room temperature, but lower than those used in high temperature implants, with quasi-room temperature implant temperatures typically ranging from 50–100° C.

Heated implants, for example, are becoming more common, whereby the process temperature is typically achieved via a heated chuck, where the workpiece is generally fixed to a clamping surface of the heated chuck during implantation by electrostatic force or mechanical clamping. For example, a heated electrostatic chuck (ESC) holds or clamps the workpiece using electrostatic force, while mechanical clamping mechanically maintains a position of the workpiece relative to the heated chuck by mechanical means. A conventional high temperature ESC, for example, comprises a set of heaters embedded under the clamping surface for heating the ESC and workpiece to the process temperature (e.g., 100° C.-600° C.), whereby a gas interface conventionally provides a thermal interface from the clamping surface to the backside of the workpiece.

During a heated implant, outgassing from the workpiece (e.g., from a substrate of the workpiece and/or films, photo resist, etc. formed on the substrate) tends to increase with processing temperature. Such outgassing can cause the pressure within the process chamber to increase, as well as introducing foreign, unwanted materials and gasses into the process chamber. An increase in pressure in the process chamber can cause negative effects on the ion beam and the process, thus lowering a throughput, as the implant is typically paused until the process chamber pressure (e.g., a vacuum) recovers to a stable condition.

SUMMARY

The present invention overcomes the limitations of the prior art by providing a system, apparatus, and method for abating outgassing associated with a heating of a workpiece in an ion implantation system. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with the present disclosure, a workpiece processing system, such as an ion implantation system for implanting ions into a workpiece, is provided. The workpiece processing system, for example, may comprise an ion implantation apparatus configured to provide a plurality of ions to a workpiece positioned in a process chamber, wherein the process chamber has a process environment associated therewith.

According to one example, an outgassing chamber is operably coupled to the process chamber, wherein the outgassing chamber comprises an outgassing chamber valve configured to selectively isolate the processing environment from an outgassing environment defined within the outgassing chamber. The outgassing chamber, for example, comprises a first workpiece support configured to selectively support the workpiece within the outgassing environment. A heater, for example, is further associated with the outgassing chamber, wherein the heater is configured to selectively heat the workpiece to a first predetermined temperature. The heater may comprise one or more of a heated workpiece support, a heat lamp, or any other apparatus configured to heat the workpiece.

In one example, a vacuum source is in selective fluid communication with the outgassing chamber, wherein the vacuum source is configured to selectively depressurize the outgassing chamber to a first predetermined pressure. A workpiece transfer apparatus, for example, is configured to selectively transfer the workpiece between the outgassing chamber and the process chamber. Furthermore, a controller is configured to selectively isolate the workpiece in the outgassing chamber via a control of the outgassing chamber valve when the workpiece resides in the outgassing chamber. The controller, for example, is further configured to concurrently heat the workpiece to the first predetermined temperature via a control of the heater and to depressurize the outgassing chamber to the first predetermined pressure via a control of the vacuum source. The controller, for example, is further configured to maintain the workpiece at approximately the first predetermined temperature and approximately the first predetermined pressure for a first period of time associated with a predetermined outgassing threshold.

In another example, the controller is further configured to selectively transfer the workpiece between the outgassing chamber and the process chamber via a control of the workpiece transfer apparatus. The controller, for example, is configured to transfer the workpiece from the outgassing chamber to the process chamber once the predetermined outgassing threshold is reached.

The predetermined outgassing threshold, for example, may be defined by an amount of gas that is outgassed from the workpiece or an outgassing pressure within the outgassing chamber. The outgassing chamber, for example, may comprise a pressure sensor configured to measure the outgassing pressure within the outgassing chamber. In one example, the predetermined outgassing threshold is defined by the outgassing pressure being less than 50 millitorr. In another example, the first predetermined pressure is the same as the outgassing pressure. In another example, the first period of time is approximately 5 seconds. In yet another example, the predetermined outgassing threshold is defined by the first period of time.

In accordance with another example, a purge source is provided in selective fluid communication with the outgassing chamber, wherein the purge source is configured to selectively pressurize the outgassing chamber to a second predetermined pressure, and wherein the second predetermined pressure is greater than the first predetermined pressure. The second predetermined pressure may be approximately atmospheric pressure or between the first predetermined pressure and atmospheric pressure. The purge source may comprise a source of an inert gas such as nitrogen.

The controller, for example, may be further configured to provide the workpiece at approximately the second predetermined pressure for a second period of time associated with the predetermined outgassing threshold via a control of the purge source. The controller, for example, may be further configured to provide the workpiece at a second predetermined temperature for the second period of time via a control of the heater. In another example, the controller may be further configured to provide the workpiece at the first predetermined pressure and second predetermined pressure via a control of the vacuum source and purge source for a predetermined number of iterations. The first predetermined period of time and second predetermined period of time, for example, are variable and based on the iteration of providing the workpiece at the first predetermined pressure and second predetermined pressure.

In another example, the outgassing chamber comprises a load lock chamber operably coupled to the process chamber, wherein the load lock chamber further comprises an atmospheric valve configured to selectively isolate the outgassing environment from an external environment. The workpiece transfer apparatus may also be configured to selectively transfer the workpiece between the outgassing chamber and the process chamber through the outgassing valve.

A chuck, such as an electrostatic chuck, may be configured to support the workpiece within the process chamber during a processing of the workpiece. The chuck may be further configured to heat the workpiece to a processing temperature. In one example, the first predetermined temperature is greater than the process temperature. In another example, the chuck is configured cool the workpiece to a processing temperature.

In yet another example, the controller is further configured to determine one or more of the first predetermined temperature, first predetermined pressure, and first period of time, based, at least in part, on a desired process throughput. Further, a temperature monitoring system may be provided and configured to measure a temperature of the workpiece.

In accordance with another exemplary aspect of the disclosure, a method is provided for mitigating outgassing in a processing system. The method, for example, comprises positioning a workpiece in an outgassing chamber, wherein the outgassing chamber is operatively coupled to a process chamber, and wherein the process chamber has a process environment associated therewith. The workpiece is selectively isolated from the process chamber in the outgassing chamber, wherein the outgassing chamber has an outgassing environment associated therewith. The workpiece is heated to a first predetermined temperature, and the outgassing chamber is depressurized to a first predetermined pressure concurrent with heating the workpiece, thereby inducing an outgassing of the workpiece and forming an outgassed product. The first predetermined pressure is maintained within the outgassing chamber for a first period of time associated with a predetermined outgassing threshold, and the outgassed product is removed from the outgassing chamber.

In one example, isolating the workpiece from the process chamber in the outgassing chamber comprises closing an outgassing chamber valve disposed between the outgassing chamber and the process chamber, thereby isolating the outgassing environment from the processing environment. Positioning the workpiece in the outgassing chamber, for example, may comprise positioning the on a workpiece support in the outgassing chamber. Heating the workpiece to the first predetermined temperature may comprise exposing the workpiece to one or more of a heated workpiece support, a heat lamp, or any other apparatus configured to heat the workpiece. In one example, depressurizing the outgassing chamber to the first predetermined pressure comprises evacuating the outgassing chamber via a vacuum source that is in selective fluid communication with the outgassing chamber.

In another example, the workpiece is further transferred from the outgassing chamber to the process chamber after removing the outgassed product from the outgassing chamber. Transferring the workpiece from the outgassing chamber to the process chamber, for example, further comprises placing the workpiece on a chuck within the process chamber. The workpiece may be further heated to a processing temperature via the chuck. The first predetermined temperature, for example, may be greater than the process temperature. In another example, the workpiece is cooled to a processing temperature via the chuck, where the first predetermined temperature is less than the process temperature. In accordance with another example, ions may be further implanted into the workpiece in the process chamber.

In another example, the method comprises pressurizing the outgassing chamber to a second predetermined pressure with a purge gas after the first period of time, wherein the second predetermined pressure is greater than the first predetermined pressure. The second predetermined pressure may be approximately atmospheric pressure or between the first predetermined pressure and atmospheric pressure. The second predetermined pressure may be maintained for a second period of time associated with the predetermined outgassing threshold. The workpiece may be further heated to a second predetermined temperature for the second period of time.

The method may further iteratively provide the first predetermined pressure and second predetermined pressure by controlling a vacuum source and a purge source. For example, the first predetermined period of time and second predetermined period of time may be variable, based on the iteration of providing the workpiece at the first predetermined pressure and second predetermined pressure. One or more of the first predetermined temperature, first predetermined pressure, and first period of time, for example, may be determined based, at least in part, on a desired process throughput.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
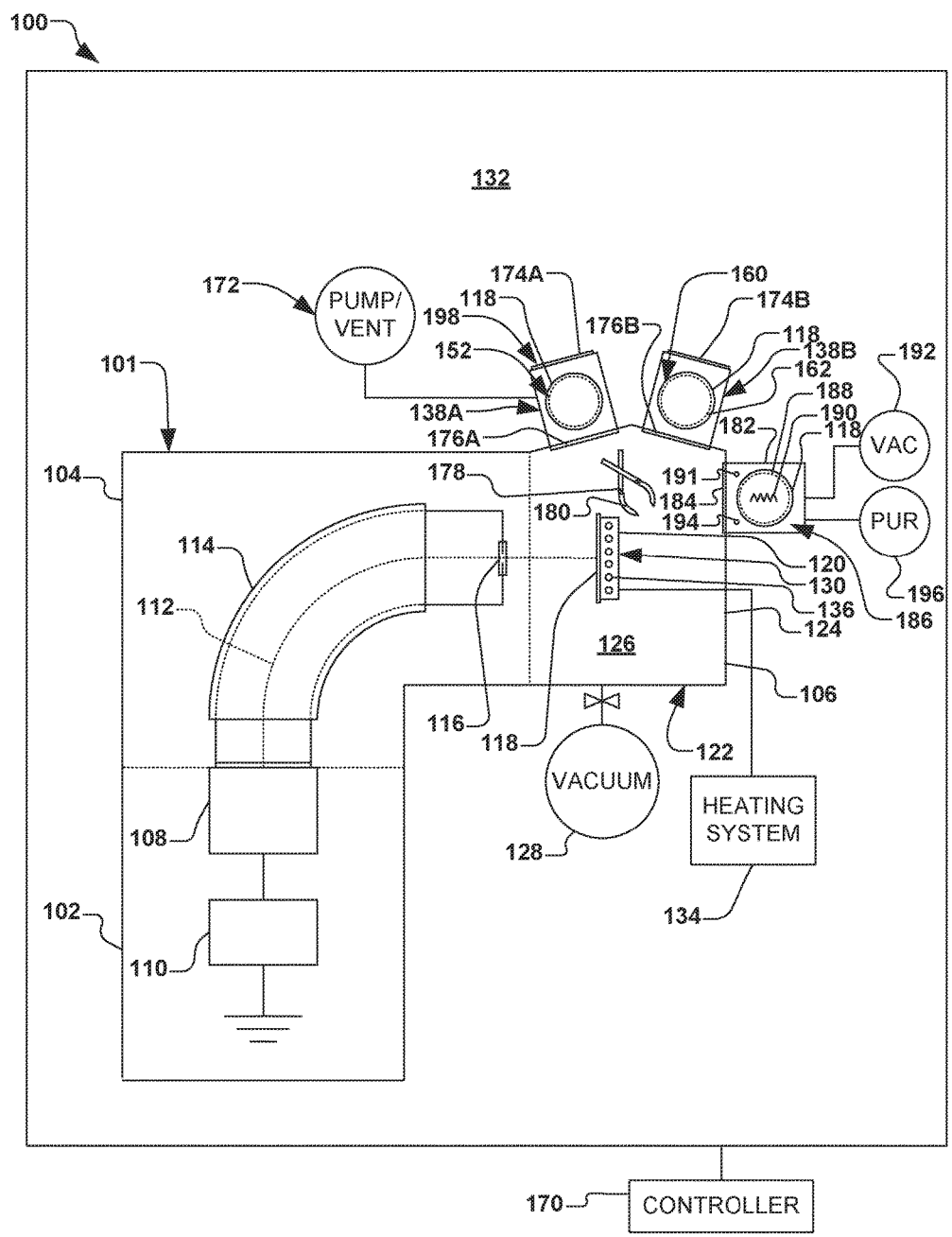
FIG. 1 is a block diagram of an exemplary vacuum system comprising an ion implantation system in accordance with several aspects of the present disclosure.

The present disclosure is directed generally toward a system, apparatus, and method for mitigating outgassing of a workpiece in a heated ion implantation system. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In accordance with one aspect of the present disclosure, FIG. 1 illustrates an exemplary ion implantation system 100.

The ion implantation system 100 in the present example comprises an exemplary ion implantation apparatus 101, however various other types of vacuum-based semiconductor processing systems are also contemplated, such as plasma processing systems, or other semiconductor processing systems. The ion implantation apparatus 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a mass analysis apparatus 114, and out an aperture 116 towards the end station 106. In the end station 106, the ion beam 112 bombards a workpiece 118 (e.g., a substrate such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

In an exemplary ion implantation utilizing the exemplary ion implantation system 101 (e.g., a Purion M or Purion H ion implantation system manufactured by Axcelis Technologies of Beverly, Mass.), a workpiece 118 having a diameter of 300 mm is exposed to the ion beam 112.

In one example, the ion implantation apparatus 101 is configured to provide a high temperature ion implantation, wherein the workpiece 118 is heated to a process temperature (e.g., approximately 100-600° C.) on the chuck 120. Thus, in the present example, the chuck 120 comprises a heated chuck 130, wherein the heated chuck is configured to support and retain the workpiece 118 while further heating the workpiece 118 within the process chamber 122 prior to, during, and/or after the exposure of the workpiece to the ion beam 112.

The heated chuck 130 of the present example comprises an electrostatic chuck (ESC) configured to heat the workpiece 118 to a processing temperature that is considerably greater than an ambient or atmospheric temperature of the surroundings or external environment 132 (e.g., also called an "atmospheric environment"). It should be noted, however, that the heated chuck 130 may alternatively comprise a chuck having mechanical clamps (not shown) for selectively securing the workpiece 118 thereto.

A heating system 134 may be further provided, wherein the heating system is configured to heat the heated chuck 130 and, in turn, the workpiece 118 residing thereon to the desired processing temperature. The heating system 134, for example, is configured to selectively heat the workpiece 118 via one or more heaters 136 disposed within the heated chuck 130.

For some high temperature implants, the workpiece 118 is allowed to "soak" on the heated chuck 130 within the vacuum of the process environment 126 until the desired temperature is reached. Alternatively, in order to increase cycle time through the ion implantation system 100 the workpiece may be pre-heated in one or more chambers 138A, 138B (e.g., one or more load lock chambers) operatively coupled to the process chamber 122 via a pre-heat apparatus 152.

Depending on the tool architecture, process, and desired throughput, the workpiece 118 may be preheated to the first temperature via the pre-heat apparatus 152, wherein the first temperature is equal to or higher than the process temperature, thus allowing for a final thermal equalization at the heated chuck 130 inside the vacuum chamber 124. Such a scenario allows the workpiece 118 to lose some heat during transfer to the process chamber 122, wherein final heating to the process temperature is performed at the heated chuck 130. In other examples, the present disclosure contemplates the first temperature being lower than, equal to, or higher than the process temperature.

The pre-heat apparatus 152 associated with the one or more chambers (e.g., illustrated in chamber 138A in FIG. 1) can heat the workpiece 118 at the atmospheric pressure of the external environment 132 prior to bringing the workpiece to the vacuum of the process environment 126 of the process chamber 120. In some instances, the workpiece 118 may be heated from an initial temperature (e.g., room temperature) to a first predetermined temperature on the pre-heat apparatus 152.

In order to attain heat transfer during processing, the back side of the workpiece 118 is brought into conductive communication with the heated chuck 130. This conductive communication is achieved through a pressure controlled gas interface (also called "back side gas") between the heated chuck 130 and the workpiece 118. Pressure of the back side gas, for example, is generally limited by the electrostatic force of the heated chuck 130, and can be generally kept in the range of 1-20 Torr. In one example, the back side gas interface thickness (e.g., the distance between the workpiece 118 and the heated chuck 130) is controlled on the order of microns (typically 5-20 µm), and as such, the molecular mean free path in this pressure regime becomes large enough for the interface thickness to push the system into the transitional and molecular gas regime.

The present disclosure contemplates utilizing the system 100 for a so-called "high temperature implant", whereby the heated chuck 130 is heated to a high implant temperature of approximately 100-600° C., as well as quasi-room temperature implants at temperatures between 20-100° C. Further, the chuck 120 may be cooled to provide low temperature implants at temperatures below 20° C. In a high temperature implant, the workpiece 118 may be further pre-heated to approximately the high implant temperature prior to being placed on the heated chuck 130, whereby the preheated workpiece 118 is loaded onto the heated chuck and the high temperature implant is performed. Thus, the present disclosure provides a system and method to perform high temperature implants, quasi-room temperature implants, and low temperature implants.

In accordance with another exemplary aspect, a controller 170 is further provided and configured to selectively activate the heating system 134, the pre-heat apparatus 152, and the cooling apparatus to selectively heat or cool the workpiece 118 respectively residing thereon. The controller 170, for example, may be configured to heat the workpiece 118 in chamber 138A via the pre-heat apparatus 152, to heat the workpiece to a predetermined temperature in the processing chamber 122 via the heated chuck 130 and heating system 134, to implant ions into the workpiece via the ion implantation apparatus 101, to cool the workpiece in chamber 138B via the cooling apparatus 160, and to selectively transfer the workpiece between the atmospheric environment 132 and the vacuum environment 126 via control of a pump and vent 172, the respective atmospheric doors 174A, 174B and vacuum doors 176A, 176B of the respective chambers 138A, 138B, and workpiece transfer apparatus 178 (e.g., a robot with an end effector 180 configured to support the workpiece). The workpiece 118, for example, can be held or supported by the end effector 180 via the workpiece transfer apparatus 178 e.g., a robot) of FIG. 1. The end effector 180, for example, may comprise a tray or other style of passive gripping mechanism where the workpiece 118 rests on the end effector by gravity.

In accordance with one exemplary aspect of the present disclosure, an outgassing chamber 182 is provided, wherein the outgassing chamber is selectively isolated from the vacuum chamber 124, and wherein the outgassing chamber is configured to advantageously induce the outgassing of the workpiece 118. The outgassing chamber 182, for example, is operably coupled to the process chamber 124, wherein the outgassing chamber comprises an outgassing chamber valve 184 configured to selectively isolate the processing environment 126 from an outgassing environment 186 defined within the outgassing chamber. The outgassing chamber 182, for example, further comprises a first workpiece support 188 configured to selectively support the workpiece 118 within the outgassing environment 186.

A heater 190, for example, is associated with the outgassing chamber 182, wherein the heater is configured to selectively heat the workpiece 118 to a first predetermined temperature. The first predetermined temperature, for example, can be greater than the process temperature. Alternatively, the first predetermined temperature, can be less than or equal to the process temperature. The heater 190, for example, may comprise one or more of a heated workpiece support, a heat lamp, or any other apparatus configured to heat the workpiece 118. A temperature monitoring system 191, for example, can be provided to measure a temperature of the workpiece 118.

According to one example, a vacuum source 192 is provided in selective fluid communication with the outgassing chamber 182, wherein the vacuum source is configured to selectively depressurize the outgassing chamber (e.g., the outgassing environment 186) to a first predetermined pressure.

The workpiece transfer apparatus 178, for example, is further configured to selectively transfer the workpiece 118 between the outgassing chamber 182 and the process chamber 124. For example, the workpiece transfer apparatus 178 is configured to selectively transfer the workpiece 118 between the outgassing chamber 182 and the process chamber 124 through the outgassing chamber valve 184.

Further, in accordance with another example, the controller 170 is further configured to selectively isolate the workpiece 118 in the outgassing chamber 182 via a control of the outgassing chamber valve 184 when the workpiece resides in the outgassing chamber. The controller 170, for example, is further configured to heat the workpiece 118 to the first predetermined temperature via a control of the heater 190 and to concurrently depressurize the outgassing chamber 182 to the first predetermined pressure via a control of the vacuum source 192. Accordingly, the controller 170 is configured to maintain the workpiece 118 at approximately the first predetermined temperature and approximately the first predetermined pressure for a first period of time associated with a predetermined outgassing threshold.

The controller 170, for example, is further configured to selectively transfer the workpiece 118 between the outgassing chamber 182 and the process chamber 124 via a control of the workpiece transfer apparatus 178. The controller 170, for example, can be configured to transfer the workpiece 118 from the outgassing chamber 182 to the process chamber 124 once the predetermined outgassing threshold has been reached. The predetermined outgassing threshold, for example, can be defined by an amount of gas that is outgassed from the workpiece 118 within the outgassing chamber 182. The predetermined outgassing threshold, for example, can be further or alternatively defined by an outgassing pressure associated with the outgassing environment 186 within the outgassing chamber 182. In one example, the first predetermined pressure can be equal to the outgassing pressure. The outgassing chamber 182, for example, can comprise a pressure sensor 194 configured to measure the outgassing pressure within the outgassing chamber.

In one example, the predetermined outgassing threshold is defined by the outgassing pressure being less than 50 millitorr. In another example, the first period of time is approximately 5 seconds. The first predetermined pressure and first period of time, for example, can be selected based on one or more of experimental data, process throughput, and/or other factors.

In accordance with another exemplary aspect, a purge source 196 is provided in selective fluid communication with the outgassing chamber 182. The purge source 196, for example, can be configured to selectively pressurize the outgassing chamber 182 to a second predetermined pressure, wherein the second predetermined pressure is greater than the first predetermined pressure. In one example, the second predetermined pressure is approximately atmospheric pressure. In another example, the second predetermined pressure is between the first predetermined pressure and atmospheric pressure. The purge source 196, for example, can comprise a source of an inert gas, such as nitrogen.

According to the present example, the controller 170 can be further configured to provide the workpiece 118 at approximately the second predetermined pressure for a second period of time associated with the predetermined outgassing threshold via a control of the purge source 196. Accordingly, the controller 170 can be further configured to provide the workpiece 118 at a second predetermined temperature for the second period of time via a control of the heater 190. The controller 170 can be further configured to provide the workpiece 118 at the first predetermined pressure and second predetermined pressure via a control of both of the vacuum source 192 and purge source 196 for a predetermined number of iterations. For example, the first predetermined period of time and second predetermined period of time can be fixed or variable and based, at least in part, on the iteration of providing the workpiece 118 at the first predetermined pressure and second predetermined pressure, as described above. The controller 170, for example, can be further configured to determine one or more of the first predetermined temperature, first predetermined pressure, and first period of time, based, at least in part, on a desired process throughput.

In one example, the outgassing environment 186 within the outgassing chamber 182 is in selective fluid communication only with the processing environment 126 via the control of the outgassing chamber valve 184, whereby the outgassing environment is not permitted to fluidly communicate with the external environment 132. In accordance with another example, the outgassing chamber 182 can comprise a load lock chamber 198 (e.g., chamber 138A) operably coupled to the process chamber 124, wherein the load lock chamber further comprises an atmospheric valve (e.g., atmospheric door 174A) configured to selectively isolate the outgassing environment 186 from the external environment 132.

Figure 2:
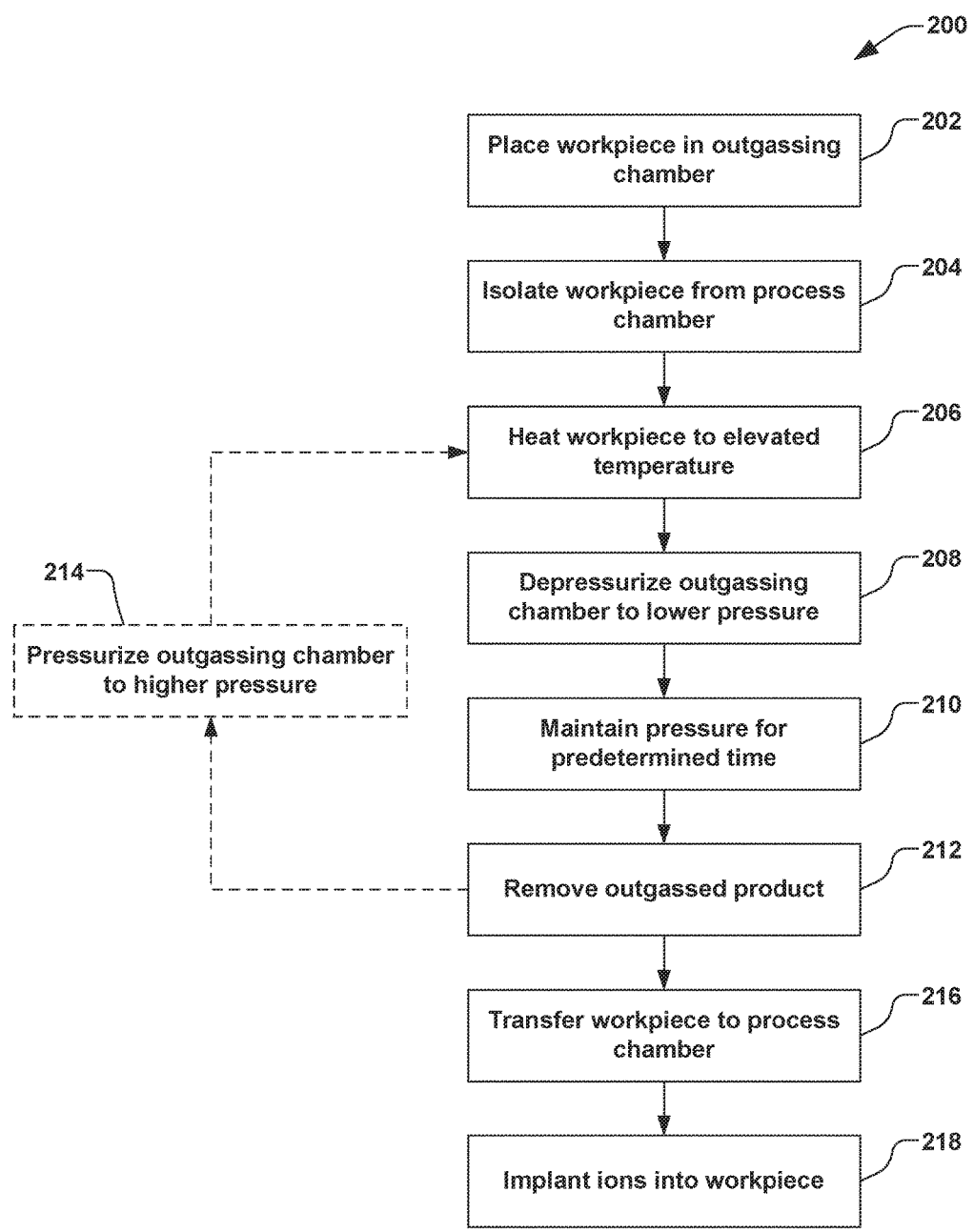
FIG. 2 illustrates a methodology for mitigating outgassing of a workpiece in accordance with to another aspect of the disclosure.

The present disclosure further provides a method 200 in FIG. 2 for mitigating outgassing of a workpiece in a processing system, such as the system 100 of FIG. 1. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

As illustrated in FIG. 2, the method 200 begins at act 202, wherein a workpiece is positioned in an outgassing chamber that is operatively coupled to a process chamber. For example, the workpiece 118 of FIG. 1 can be positioned or placed the on the workpiece support 188 in the outgassing chamber 182

In act 204 of FIG. 2, the workpiece is isolated from the process chamber in the outgassing chamber, thereby isolating the outgassing environment from the process environment. Isolating the workpiece from the process chamber in the outgassing chamber, for example, can comprise closing the outgassing chamber valve 184 of FIG. 1, thereby isolating the outgassing environment 186 from the processing environment 126.

In act 206 of FIG. 2, the workpiece is heated to a first predetermined temperature, such as by exposing the workpiece to one or more of a heated workpiece support and a heat lamp configured to heat the workpiece. In act 208, the outgassing chamber concurrently depressurized to a first predetermined pressure concurrent with the heating of the workpiece in act 206. For example, the outgassing chamber 182 of FIG. 1 can be evacuated or pumped down via the vacuum source 192 that is in selective fluid communication with the outgassing chamber. Accordingly, an outgassing of the workpiece 118 is induced by acts 206 and 208 of FIG. 2, thereby forming an outgassed product. In act 210, the first predetermined pressure is maintained for a first period of time associated with a predetermined outgassing threshold, whereby the outgassing of the workpiece may continue. In act 212, the outgassed product is removed from the outgassing chamber, such as via the vacuum source 192 of FIG. 1. It is noted that acts 208 and 212 of FIG. 2 may be performed concurrently, whereby the outgassed product is removed concurrent with the depressurization of the outgassing chamber.

In one alternative, after the outgassed product is removed from the outgassing chamber in act 212, the outgassing chamber can be pressurized to a second predetermined pressure with a purge gas in act 214 after the first period of time. In one example, whereby the second predetermined pressure is greater than the first predetermined pressure. The second predetermined pressure and second period of time, for example, may be further associated with the predetermined outgassing threshold. Acts 206, 208, 210, 212, and 214 may be performed iteratively by selectively controlling the vacuum source 192, purge source 196, and heater 190 of FIG. 1.

In accordance with one example, the predetermined outgassing threshold is advantageously determined by characterizing an outgassing the workpiece prior to performing the method 200 of FIG. 2. For example, one or more of the first predetermined pressure, first predetermined temperature, a first period of time are characterized using a sample workpiece having similar characteristics as the workpiece 118 of FIG. 1. For example, the workpiece 118 can comprise various materials, whereby each material has a vapor temperature and pressure curve. The predetermined outgassing threshold, for example, can be derived empirically, theoretically, or any combination thereof. For example, the predetermined outgassing threshold can be based on experimental data and/or calculations based on the material composition of the workpiece 118 and respective vapor pressure(s) of the constituents of the workpiece. An analysis of variations in pressure within the process chamber 124 that are caused by the outgassing of the workpiece 118 can be further utilized to determine the predetermined outgassing threshold. For example, the workpiece 118 can be heated without isolation from the process chamber 124 (e.g., the outgassing chamber valve 184 is open), whereby during the heating of the workpiece, the pressure within the process chamber is monitored with respect to time in order to determine the impact of outgassing. The time it takes for the process chamber to recover to a predetermined pressure (e.g., an "acceptable" pressure based on desired process parameters), for example, can be thus utilized as one aspect of the predetermined outgassing threshold.

The method 200 of FIG. 2, for example, can further comprise transferring the workpiece from the outgassing chamber to the chuck within the process chamber in act 216, such as after removing the outgassed product is removed from the outgassing chamber in act 212. Further, ions can be implanted into the workpiece in the process chamber in act 218.

The method 200 may further comprise determining one or more of the first predetermined temperature, first predetermined pressure, and first period of time, based, at least in part, on a desired process throughput of workpieces through the system 100 of FIG. 1.

Accordingly, the present disclosure provides an advantageous outgassing of workpieces being processed in an ion implantation system. It is noted that depressurizing the outgassing chamber can be a single, continuous evacuation of the outgassing chamber until a rate of outgassing rate is below a predetermined satisfactory rate. Alternatively, one or more evacuate and vent/purge sequences can be implemented in the outgassing chamber to remove outgassed products. For example, once most of the outgassing has occurred in the outgassing chamber 182 of FIG. 1, for example, the workpiece 118 can be advantageously brought into the process chamber 124 to be implanted with ions. Since the workpiece 118 has already been heated and depressurized, the amount of outgasses are reduced once the workpiece is transferred into the process chamber 124.

Thus, the present disclosure advantageously isolates the workpiece 118 from process chamber 124 for outgassing, while not affecting the process environment 126 within the process chamber. Such isolation reduces outgassing in the process chamber 124 by preheating and pumping outgassed products in an isolated chamber (e.g., the outgassing chamber 182). As outgassing is a function of temperature and pressure of the workpiece, evacuating the outgassing chamber 182 for a longer periods of time will help remove outgasses that may occur. Further, by controlling a number of pump and purges (e.g., acts 208 and 214 of FIG. 2), additional outgassing of the workpiece can be advantageously achieved. For example, three pump and purge cycles may be performed, whereby the workpiece is first at atmospheric pressure while in the outgassing chamber (e.g., act 204), heated (e.g., act 206) and pumped down to the first predetermined pressure (e.g., 50 millitorr in act 208). Once the first predetermined pressure is reached, a purge or pressurization (e.g., act 214) is performed to bring the workpiece up to the second predetermined elevated pressure (e.g., atmospheric pressure). Once at the second predetermined pressure, acts 206, 208, 210, 212, and 214 may be repeated (e.g., 2-3 repetitions).

Thus, when transferred into the process chamber in act 216, very little subsequent outgassing of the workpiece occurs inside the process chamber. The present disclosure further allows parallel processing of workpieces. For example, while a first workpiece is undergoing the method 200 of FIG. 2, another workpiece may be loaded into the loadlock chamber 138A and/or be implanted in the process chamber 124. Thus, by having the outgassing chamber 182 being a separate chamber coupled to the process chamber 124, throughput may be increased while minimizing deleterious outgassing heretofore seen. Furthermore, the outgassing chamber 182 can be configured to concurrently support and heat a plurality of workpieces 118. In such an instance, the heater 190 may comprise heat lamps or another heating apparatus configured to concurrently heat the plurality of workpieces within the outgassing chamber.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A workpiece processing system, comprising:
a process chamber for processing a workpiece, the process chamber having a process environment associated therewith;
an outgassing chamber operably coupled to the process chamber, wherein the outgassing chamber comprises an outgassing chamber valve configured to selectively isolate the processing environment from an outgassing environment defined within the outgassing chamber, and wherein the outgassing chamber comprises a first workpiece support configured to selectively support the workpiece within the outgassing environment;

a heater associated with the outgassing chamber, wherein the heater is configured to selectively heat the workpiece to a first predetermined temperature;

a vacuum source in selective fluid communication with the outgassing chamber, wherein the vacuum source is configured to selectively depressurize the outgassing chamber to a first predetermined pressure;

a workpiece transfer apparatus configured to selectively transfer the workpiece between the outgassing chamber and the process chamber; and a controller configured to isolate the workpiece in the outgassing chamber via a control of the outgassing chamber valve when the workpiece resides in the outgassing chamber, wherein the controller is further configured to concurrently heat the workpiece to the first predetermined temperature via a control of the heater and to depressurize the outgassing chamber to the first predetermined pressure via a control of the vacuum source, wherein the controller is further configured to maintain the workpiece at approximately the first predetermined temperature and approximately the first predetermined pressure for a first period of time associated with a predetermined outgassing threshold.

2. The workpiece processing system of claim 1, wherein the controller is further configured to selectively transfer the workpiece between the outgassing chamber and the process chamber via a control of the workpiece transfer apparatus.

3. The workpiece processing system of claim 1, wherein the predetermined outgassing threshold is defined by an amount of gas that is outgassed from the workpiece.

4. The workpiece processing system of claim 1, wherein the outgassing chamber comprises a pressure sensor configured to measure an outgassing pressure within the outgassing chamber.

5. The workpiece processing system of claim 4, wherein the predetermined outgassing threshold is defined by the outgassing pressure being less than 50 millitorr.

6. The workpiece processing system of claim 1, wherein the predetermined outgassing threshold is defined by the first period of time.

7. The workpiece processing system of claim 1, further comprising a purge source in selective fluid communication with the outgassing chamber, wherein the purge source is configured to selectively pressurize the outgassing chamber to a second predetermined pressure, wherein the second predetermined pressure is greater than the first predetermined pressure.

8. The workpiece processing system of claim 7, wherein the second predetermined pressure is approximately atmospheric pressure.

9. The workpiece processing system of claim 7, wherein the second predetermined pressure is between the first predetermined pressure and atmospheric pressure.

10. The workpiece processing system of claim 7, wherein the purge source comprises a source of an inert gas.

11. The workpiece processing system of claim 10, wherein the inert gas comprises nitrogen.

12. The workpiece processing system of claim 7, wherein the controller is further configured to provide the workpiece at approximately the second predetermined pressure for a second period of time associated with the predetermined outgassing threshold via a control of the purge source.

13. The workpiece processing system of claim 12, wherein the controller is further configured to provide the workpiece at a second predetermined temperature for the second period of time via a control of the heater.

14. The workpiece processing system of claim 7, wherein the controller is further configured to provide the workpiece at the first predetermined pressure and second predetermined pressure via a control of the vacuum source and purge source for a predetermined number of iterations.

15. The workpiece processing system of claim 14, wherein the first predetermined period of time and second predetermined period of time is variable, based on the iteration of providing the workpiece at the first predetermined pressure and second predetermined pressure.

16. The workpiece processing system of claim 1, wherein the outgassing chamber comprises a load lock chamber operably coupled to the process chamber, wherein the load lock chamber further comprises an atmospheric valve configured to selectively isolate the outgassing environment from an external environment.

17. The workpiece processing system of claim 1, further comprising a chuck configured to support the workpiece within the process chamber during a processing of the workpiece, wherein the chuck is further configured to heat the workpiece to a processing temperature.

18. The workpiece processing system of claim 17, wherein the first predetermined temperature is greater than the processing temperature.

19. The workpiece processing system of claim 1, wherein the controller is further configured to determine one or more of the first predetermined temperature, first predetermined pressure, and first period of time, based, at least in part, on a desired process throughput.

* * * * *